(12) United States Patent
Frezza

(10) Patent No.: US 7,269,897 B2
(45) Date of Patent: Sep. 18, 2007

(54) MANUFACTURING PROCESS OF A STACKED SEMICONDUCTOR DEVICE

(75) Inventor: Giovanni Frezza, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 81 days.

(21) Appl. No.: 10/745,296

(22) Filed: Dec. 23, 2003

(65) Prior Publication Data

US 2004/0163240 A1 Aug. 26, 2004

(30) Foreign Application Priority Data

Dec. 24, 2002 (IT) .......................... MI2002A2767

(51) Int. Cl.
*H05K 3/30* (2006.01)

(52) U.S. Cl. .................... 29/832; 29/830; 29/833; 29/835; 29/836; 156/89.11; 156/89.15; 257/686; 257/777; 257/778; 438/106; 438/114; 438/464

(58) Field of Classification Search .................. 29/834, 29/836–840, 854, 412, 417, 830, 831–833, 29/835; 156/60, 300, 89.11, 89.15; 257/686, 257/777, E21.705, E25.01, 778; 438/106–108, 438/112–114, 118, 460, 464
See application file for complete search history.

(56) References Cited

U.S. PATENT DOCUMENTS

| 5,286,679 A | | 2/1994 | Farnworth et al. ........... 437/209 |
| 5,495,398 A | * | 2/1996 | Takiar et al. ................ 257/777 |
| 6,040,204 A | | 3/2000 | Herden et al. .............. 438/109 |
| 6,165,815 A | * | 12/2000 | Ball ............................ 438/113 |
| 6,337,225 B1 | | 1/2002 | Foong et al. ................ 438/106 |
| 6,344,401 B1 | | 2/2002 | Lam ........................... 438/460 |
| 6,723,620 B1 | * | 4/2004 | Pavier ......................... 438/460 |
| 2001/0005935 A1 | | 7/2001 | Tandy ........................... 29/836 |
| 2002/0090753 A1 | | 7/2002 | Pai et al. ..................... 438/108 |
| 2002/0096755 A1 | | 7/2002 | Fukui et al. ................. 257/686 |
| 2002/0155638 A1 | | 10/2002 | Uchida ........................ 438/118 |

FOREIGN PATENT DOCUMENTS

EP 0 185 244 A1 6/1986

\* cited by examiner

*Primary Examiner*—Minh Trinh
*Assistant Examiner*—Donghai D Nguyen
(74) *Attorney, Agent, or Firm*—Lisa K. Jorgenson; Hai Han; Seed IP Law Group PLLC

(57) ABSTRACT

A manufacturing process of a stacked semiconductor device, comprising the following steps: integrating a plurality of electronic devices in a plurality of active areas realized in a semiconductor wafer; distributing an adhesive layer on active areas, splitting the semiconductor wafer into a plurality of first dies, each one comprising at least one of the active areas; mounting the plurality of first dies, which are already equipped with the adhesive layer, on a support; and mounting a plurality of second dies on the adhesive layer.

12 Claims, 3 Drawing Sheets

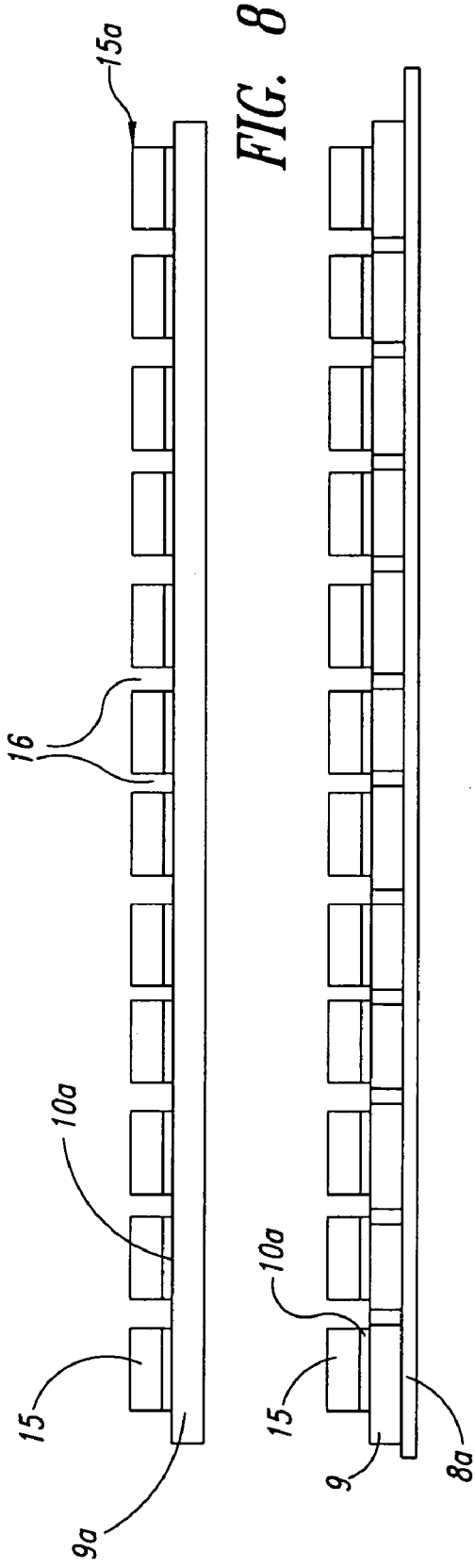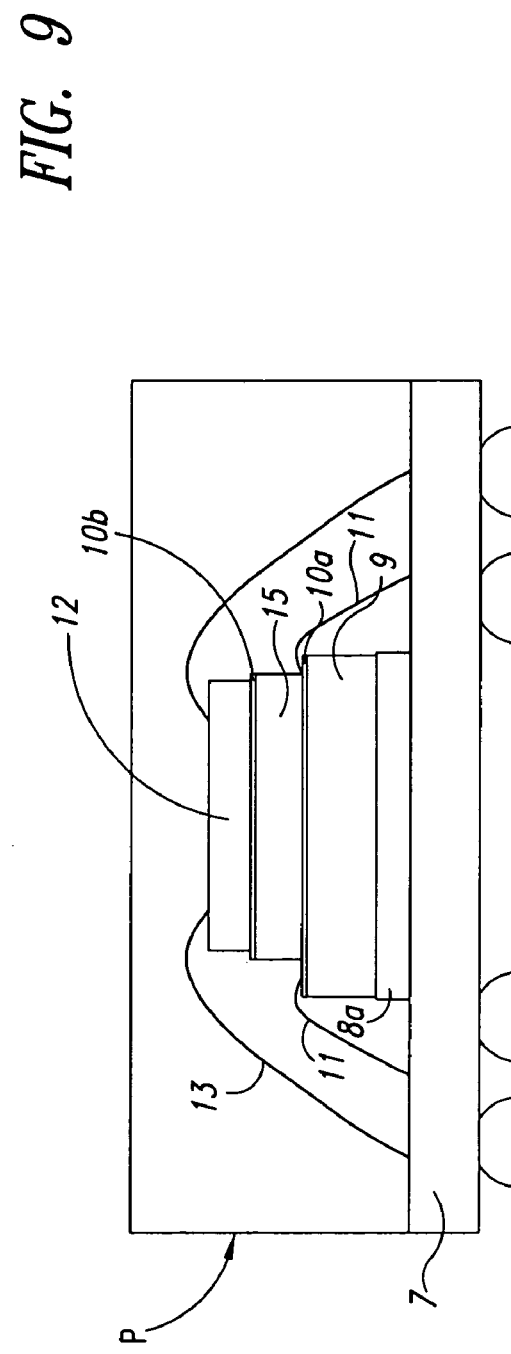

MANUFACTURING PROCESS OF A STACKED SEMICONDUCTOR DEVICE

BACKGROUND OF THE INVENTION

1. Field of the Invention

The present invention relates to a manufacturing process of a stacked semiconductor device and corresponding device.

More specifically, the invention relates to a manufacturing process of a stacked semiconductor device.

The invention also relates to a stacked semiconductor device comprising a first die mounted on a support.

The invention relates particularly, but not exclusively, to a manufacturing method of a stacked semiconductor device in so-called 3D packages for memory applications comprising a first die mounted on a support, an intermediate adhesive layer, a second die mounted on said adhesive layer, an intermediate layer, a third die and so on up to reaching a number of dies complying with the functions required by the final device and the following description is made with reference to this field of application for convenience of illustration only.

2. Description of the Related Art

As it is well known, the manufacture of a stacked semiconductor device in memory applications requires the integration of the ones on the other different semiconductor material dies, an electronic circuit being monolithically integrated on each die. In some of these applications dies have the same size. When this condition occurs it is necessary to introduce particular assembly methods to allow the different dies to be electrically connected with the support they are mounted on.

A first known solution to manufacture such devices is shown in FIG. 1.

A first die (called Mother die) 2 is mounted on a semiconductor substrate 1 through a traditional die attach process.

Electric connections are provided by means of the wire bonding technology between the die and the support in order to output electric signals. In order to keep the profile of the wires used for electric connections low and gain some thickness a reverse bonding technology is generally used. A glue layer 3, generally of the same type used to mount the first die on the support 1, is further deposited on this first die 2, whereon a second bearing die 4, called dummy die or interposer, being generally silicon-made, is rested and glue-fastened.

A further glue layer 5 is deposited on this second dummy die 4, whereon a third die or daughter die 6 is mounted.

Electric connections are provided by means of the wire bonding technology between the daughter die 6 and the substrate 1, by means of a reverse bonding technique. This process is reiterated as many times as the number of dies to be integrated. At present three dies are overlapped, but the number (in accordance with the die thickness) can even reach 8.

Although advantageous under several aspects, this first solution has several drawbacks. The first drawback is linked to the need to use a certain number of dummy dies 4 which are particularly expensive. These dummy dies 4 are assembled by die attack. The amount of glue being used and the manufacturing time increase accordingly. Moreover, to let the two dies be sufficiently spaced out it is necessary to use thick dummy dies. Consequently, very thin functional dies 2 and 6 are to be used. The reduction of the thickness of the functional die 2 and 6 beyond a certain value involves some criticalities and difficulties in the whole assembly process.

Moreover, the formation of several overlapped layers realized on a semiconductor substrate, which has already been split from the initial silicon wafer, poses different problems for the alignment and thus the reliability of the final device.

Another technology used to assemble stacked semiconductor devices is the use of glues containing spacers (glass fillers) which, although removing dummy dies 4, has the disadvantage of breaking the die protective layer called passivation layer.

BRIEF SUMMARY OF THE INVENTION

An embodiment of the present invention provides a manufacturing process of stacked devices having such features as to allow assembly costs to be reduced, devices to be simplified and the final device reliability to be improved, overcoming thus the limits and drawbacks still affecting prior art devices.

One solution idea underlying the present invention is to form an adhesive layer acting as interposer between two or more dies which must be overlapped before splitting the first die from the silicon wafer in which it is realized. In other words, an adhesive interposer, or an interposer whereon an adhesive layer can be deposited, is to be obtained at the wafer level on each die, not yet split.

According to one embodiment of the invention, there is provided a manufacturing process comprising: integrating a plurality of electronic devices in a plurality of active areas realized in a first semiconductor wafer; distributing a first adhesive layer on said active areas; splitting said semiconductor wafer into a plurality of first dies, each said first die comprising at least one of said active areas; mounting said plurality of first dies, which are already equipped with said adhesive layer on a support; and mounting a plurality of second dies on said adhesive layer.

According to another embodiment of the present invention, there is provided a stacked semiconductor device comprising a first die mounted on a support, an intermediate adhesive layer and a second die mounted on said adhesive layer, wherein this adhesive layer is a polymeric layer.

The features and advantages of the method and device according to the invention will be apparent from the following description of an embodiment thereof given by way of non-limiting example with reference to the attached drawings.

BRIEF DESCRIPTION OF THE SEVERAL VIEWS OF THE DRAWINGS

In the drawings:

FIGS. 8 and 9 are respective sectional enlarged-scale views of an embodiment of the manufacturing process according to the invention, FIG. 10 is a sectional view of a second embodiment of the stacked semiconductor device according to the invention.

DETAILED DESCRIPTION OF THE INVENTION

With reference to FIGS. 2 to 8, a first manufacturing process of a stacked semiconductor device and the corresponding device 14 are described.

Figure 1:
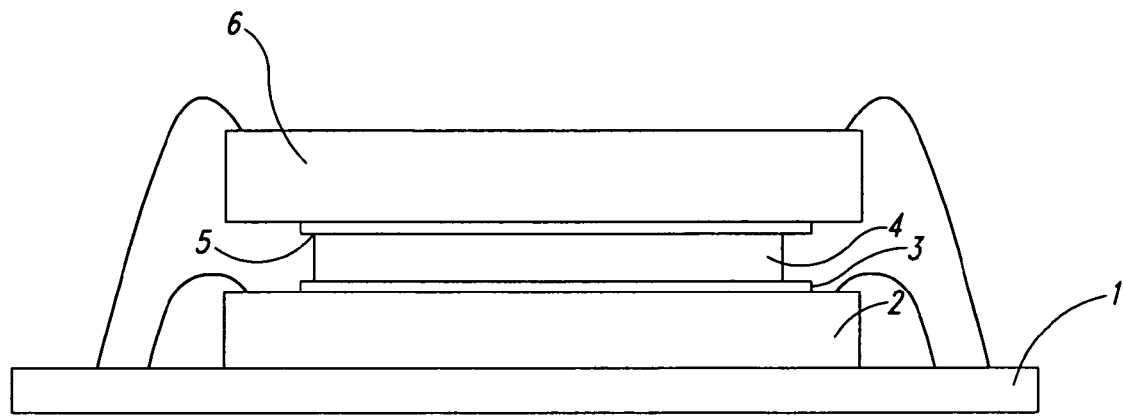
FIG. 1 is a sectional view of a known stacked semiconductor device.
Figure 2:
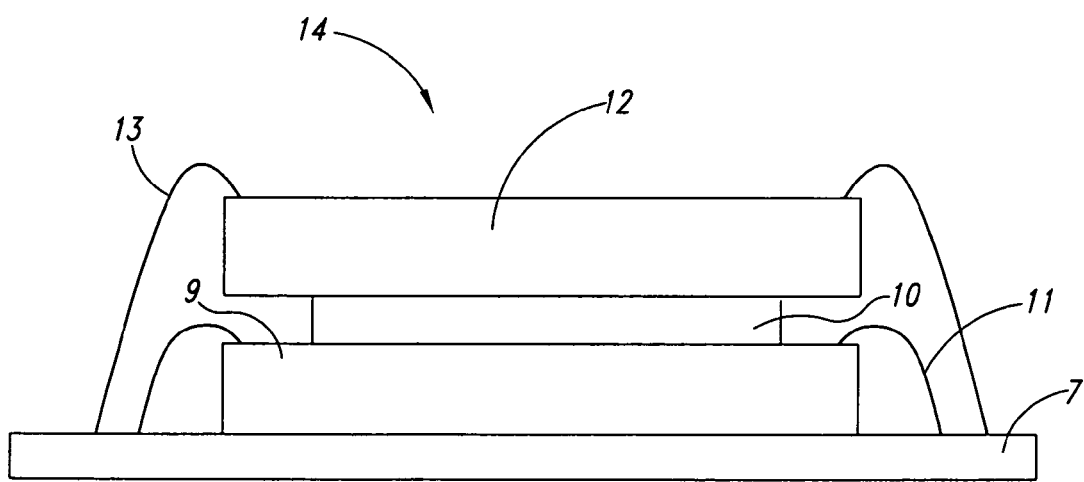
FIG. 2 is a sectional view of a stacked semiconductor device according to the invention.

In particular, with reference to FIG. 2, a device 14 according to the method of the invention is shown.

A first die 9 called "mother die," whereon different electronic devices are integrated, is mounted on a support 7, for example a substrate being generally a printed circuit.

This first die 9 is at least partially covered by an adhesive layer 10. Advantageously, according to the invention, this adhesive layer 10 is a polymeric layer. For example this adhesive layer 10 is a silicone polymer or an epoxy glue.

The first die 9 is electrically connected with the substrate 7 by means of contact wires 11.

In a preferred embodiment of the invention the adhesive layer 10 fully covers the surface of the first die 9 and it is equipped with openings to access contact pads to allow the contact wires 11 to pass.

A second die 12, wherein other electronic devices have been previously integrated according to manufacturing techniques known in this field, is then mounted on this adhesive layer 10.

The second die 12 is also electrically connected with the substrate 7 by means of contact wires 13.

With reference to FIGS. 3 to 7, the process according to the invention is now described.

Figure 3:
FIGS. 3 to 7 are respective sectional enlarged-scale views of the semiconductor device of FIG. 2 in the development of an embodiment of the manufacturing process according to the invention.
Figure 4:

In particular, FIG. 3 shows a silicon wafer 9a comprising a plurality of circuit areas, called hereafter active areas, wherein a plurality of electronic devices are integrated. An adhesive layer 10 is distributed in correspondence with these active areas, as shown in FIG. 4.

This adhesive layer 10 is a polymeric material layer and it comprises, for example, silicone polymers or epoxy glues. Advantageously, this polymeric material layer 10 is deposited on the active areas by means of screen printing or photodeposition techniques allowing precise shapes with well controlled profiles to be defined.

Advantageously, openings are formed in this adhesive layer 10 to connect the first dies 9 with the support 7.

The splitting of the single dies or chips is then performed, i.e., the wafer is cut to split the several circuit areas and to form a plurality of first dies 9.

Figure 5:

This plurality of first dies 9 is then mounted on the support 7, for example a semiconductor substrate as shown in FIG. 5, by means of a traditional die attach technique.

Figure 6:
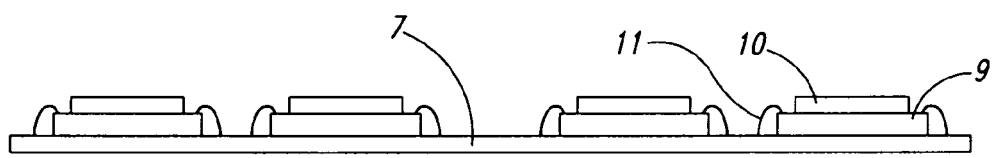

The dies 9 and the support 7, i.e., the substrate, are then electrically connected. This connection can be performed by means of different technologies, among which the most used technique provides the use of contact wires 11 and it is thus known as "wire bonding". More particularly, each contact wire 11 is welded at one end on the semiconductor material die 9 and, at the opposite end, on the support 7 whereto the die 9 is to be connected, as shown in FIG. 6.

Nothing prevents a plasma activation step from being performed on the adhesive layer 10 to improve the material adhesion to the die back being then assembled.

The manufacturing process of the device 14 according to the invention carries on with the mounting of second dies 12 on the adhesive layer 10.

Figure 7:
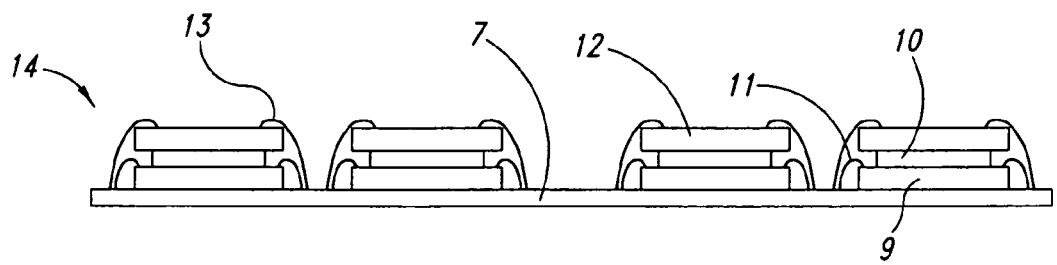

The electric connection between the second dies 12 and the support 7 is then performed using contact wires 13, as shown in FIG. 7.

The manufacturing process of the device 14 according to the invention carries on with traditional packaging techniques such as pressing for example.

The process according to the invention allows then final device manufacturing times to be considerably reduced since the adhesive layer 10 is realized directly on the wafer 9a whereon circuit active areas are formed and wherefrom the first dies 9 are obtained by splitting.

Moreover, a higher flexibility of the geometry to be obtained on the first die 9 is provided by using the screen-printing technique to distribute the adhesive layer 9 or photodefinition techniques.

Advantageously, the adhesive layer 10 is also realized by means of wafer level packaging techniques being already known in the MEMS (Micro Electro-Mechanical System) field. In this case the wafer bonding process of a silicon wafer with another wafer made of silicon or another material is used, as shown in FIGS. 8 to 10.

In particular, FIG. 8 shows a silicon wafer 9a comprising a plurality of circuit areas, called hereafter active areas, wherein a plurality of electronic devices are integrated. An adhesive layer 10a is distributed in correspondence with these active areas.

This adhesive layer 10a is a polymeric material layer comprising, for example, silicone polymers or epoxy glues or it comprises traditional welding or eutectic glass layers.

Advantageously, this adhesive layer 10a, if made of silicon polymers or epoxy glues, is deposited on the active areas by means of screen-printing or photodeposition techniques allowing precise shapes with well controlled profiles to be defined.

A second silicon wafer 15a is then mounted, having, once conveniently worked, openings 16 defining a plurality of bearing or dummy dies 15. The wafer 15a is then aligned on the wafer 9a so that the openings 16 on the wafer 15a correspond to the peripheral portion of the wafer 9a wherein electric connection pads are located and the dummy dies 15 are mounted on the respective active areas of the wafer 9a. The splitting of the so-formed single dies or chips is then performed by means of a standard cutting process after mounting the wafers on an adhesive support 8a, for example a sticky foil, as shown in FIG. 9. A plurality of dies 9, already mounted on dummy dies 15, is obtained, but so that electric connection pads are accessible and exposed.

This plurality of first dies 9 comprising the second dies 15 are then mounted on a support 7, for example a semiconductor substrate as shown in FIG. 10, by means of a traditional die attach technique.

The electric connection using the contact wires 11 between the dies 9 and the support 7, i.e., the substrate, is then performed. A third die 12 is then mounted by depositing an adhesive layer 10b, for example of the silicone polymeric or epoxy glue type, on the dummy die 15. The electric connection between the third die 12 and the substrate 7 is then performed. This connection can be performed by means of different technologies, among which the most used technique provides the use of contact wires 13 and it is thus known as "wire bonding".

Advantageously, in this case a structure is used, being similar to the prior art one, but with the advantage that the dummy die or interposer 15 is already mounted on the first die 9.

FIG. 10 shows a device manufactured with the process according to the invention using a described wafer bonding process allowing dummy dies 15, which act as spacers, to be already assembled on the first die 9 at the wafer level. The figure shows in particular the final structure of a BGA (Ball Grid Array) stacked package using a device according to the invention.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A process of manufacturing stacked semiconductor devices comprising:
   integrating a plurality of electronic devices in a plurality of active areas, the plurality of active areas being integrated in a semiconductor wafer;
   distributing a first adhesive layer on the active areas;
   splitting the semiconductor wafer into a plurality of first dies, each first die comprising at least one of the active areas and a respective portion of the first adhesive layer; and
   mounting a plurality of second dies on the respective portions of the first adhesive layer;
   mounting the plurality of first dies on a support;
   forming openings in the first adhesive layer to expose contact pads; and
   electrically connecting the support with the exposed contact pads, wherein the openings are formed prior to splitting the semiconductor wafer into the first dies and the electrically connecting step is performed after splitting the semiconductor wafer into the first dies.

2. The process of claim 1, wherein the first adhesive layer is a polymeric silicone layer.

3. The process of claim 1, wherein the first adhesive layer is distributed according to a screen-printing technique.

4. The process of claim 1, wherein the first adhesive layer is distributed according to a photo-definition technique.

5. The process of claim 1, further comprising:
   mounting a second semiconductor wafer, comprising a plurality of dummy dies, on the first adhesive layer and the first wafer, before splitting the semiconductor wafer so that the dummy dies contact the first dies; and
   placing a plurality of second adhesive layers on the plurality of dummy dies, respectively, before mounting the plurality of second dies on the second adhesive layers.

6. The process of claim 1, wherein said first adhesive layer comprises a welding layer or an eutectic glass layer.

7. The process of claim 1 wherein each first die is fully covered with the first adhesive layer.

8. The process of claim 1 wherein the first adhesive layer is a silicone layer or an epoxy layer.

9. A process of manufacturing stacked semiconductor devices comprising:
   integrating a plurality of electronic devices in a plurality of active areas, the plurality of active areas being realized integrated in a semiconductor wafer;
   distributing a plurality of adhesive layers on the active areas, respectively;
   splitting the semiconductor wafer into a plurality of first dies after distributing the adhesive layers on the active layers, each first die comprising at least one of the active areas and the respective adhesive layer; and
   mounting a plurality of second dies directly on the respective adhesive layers;
   mounting the plurality of first dies on a support;
   forming openings in the adhesive layers to expose contact pads; and
   electrically connecting the support with the exposed contact pads, wherein the openings are formed prior to splitting the semiconductor wafer into the first dies and the. electrically connecting step is performed after splitting the semiconductor wafer into the first dies.

10. The process of claim 9, wherein the adhesive layers are distributed according to a screen-printing technique.

11. The process of claim 9, wherein the adhesive layers are distributed according to a photo-definition technique.

12. The process of claim 9 wherein the adhesive layer is a silicon layer or an epoxy layer.

* * * * *